US009455735B2

(12) United States Patent
Li et al.

(10) Patent No.: US 9,455,735 B2
(45) Date of Patent: Sep. 27, 2016

(54) HIGH SPEED SAMPLING FRONT-END CIRCUIT

(71) Applicant: NO. 24 RESEARCH INSTITUTE OF CHINA ELECTRONIC TECHNOLOGY CORPORATION, Chongqing (CN)

(72) Inventors: Ting Li, Chongqing (CN); Gangyi Hu, Chongqing (CN); Ruzhang Li, Chongqing (CN); Yan Wang, Chongqing (CN); Lu Liu, Chongqing (CN); Yong Zhang, Chongqing (CN); Xu Wang, Chongqing (CN); Yuxin Wang, Chongqing (CN); Dongbing Fu, Chongqing (CN); Guangbing Chen, Chongqing (CN)

(73) Assignee: NO. 24 RESEARCH INSTITUTE OF CHINA ELECTRONIC TECHNOLOGY CORPORATION, Chongqing (CN)

( * ) Notice: Subject to any disclaimer, the term of this patent is extended or adjusted under 35 U.S.C. 154(b) by 0 days.

(21) Appl. No.: 14/371,786

(22) PCT Filed: Apr. 15, 2013

(86) PCT No.: PCT/CN2013/074200
§ 371 (c)(1),
(2) Date: Jul. 11, 2014

(87) PCT Pub. No.: WO2014/146314
PCT Pub. Date: Sep. 25, 2014

(65) Prior Publication Data
US 2015/0137854 A1 May 21, 2015

(30) Foreign Application Priority Data

Mar. 20, 2013 (CN) .......................... 2013 1 0090302

(51) Int. Cl.
*H03K 19/00* (2006.01)
*H03M 1/12* (2006.01)
*H03M 1/16* (2006.01)

(52) U.S. Cl.
CPC ........... *H03M 1/1255* (2013.01); *H03M 1/167* (2013.01)

(58) Field of Classification Search
CPC .... H03M 1/1245; H03M 1/44; H03M 1/442; G06F 1/08; G11C 27/026; G11C 27/024; G11C 27/02; G01R 13/342; H03K 17/063
USPC ................ 327/91, 93–96, 124; 341/155–172
See application file for complete search history.

(56) References Cited

U.S. PATENT DOCUMENTS

| 2009/0278716 A1* | 11/2009 | Kawahito ............ G11C 27/026 341/120 |
| 2010/0079202 A1 | 4/2010 | Sugimoto |

FOREIGN PATENT DOCUMENTS

| CN | 101635571 A | 1/2010 |
| CN | 102067454 A | 5/2011 |
| CN | 102299715 A | 12/2011 |

OTHER PUBLICATIONS

International Search Report issued in PCT/CN2013/074200 mailed Jan. 9, 2014 (with translation).

*Primary Examiner* — Lincoln Donovan
*Assistant Examiner* — Diana J Cheng
(74) *Attorney, Agent, or Firm* — Oliff PLC (57) ABSTRACT

A high-speed sampling front-end circuit is presented that includes a MDAC sampling network, a reference voltage generator circuit, a comparator array, an operational amplifier, an output short-circuit switch, an adjustable clock duty cycle stabilizer, a status control module and a feedback control module. The circuit features low power, high sampling rate and high input bandwidth of sampling network. The time constant of the MDAC sampling network and the comparator array is precisely matched one another to improve input bandwidth of the sampling network. Sampling capacitors are designed as feedback capacitors and DAC calculation capacitors, thereby the operational amplifier doubles feedback coefficient and features 50% bandwidth and 50% power. The cycle stabilizer is adopted to shorten sampling time and extend amplification phase to greatly improve sampling rate. One input reference voltage tends to simplify the design of the reference voltage generator circuit. The circuit has wide applications in pipelined A/D converters.

12 Claims, 4 Drawing Sheets

FIG. 1

PRIOR ART

HIGH SPEED SAMPLING FRONT-END CIRCUIT

BACKGROUND OF THE PRESENT INVENTION

1. Field of Invention

The invention relates to a sampling front-end circuit, particularly to a high speed sampling front-end circuit without sample and hold circuit (non-sample/hold). Its direct application is in pipelined A/D converters.

2. Description of Related Arts

As to pipelined A/D converter design, chip power and size increase as sampling rate steps up. A sampling front-end circuit takes the largest size and consumes the most power of a pipelined A/D converter. Hence, a high speed sampling front-end circuit is in need featuring low power.

Figure 1:
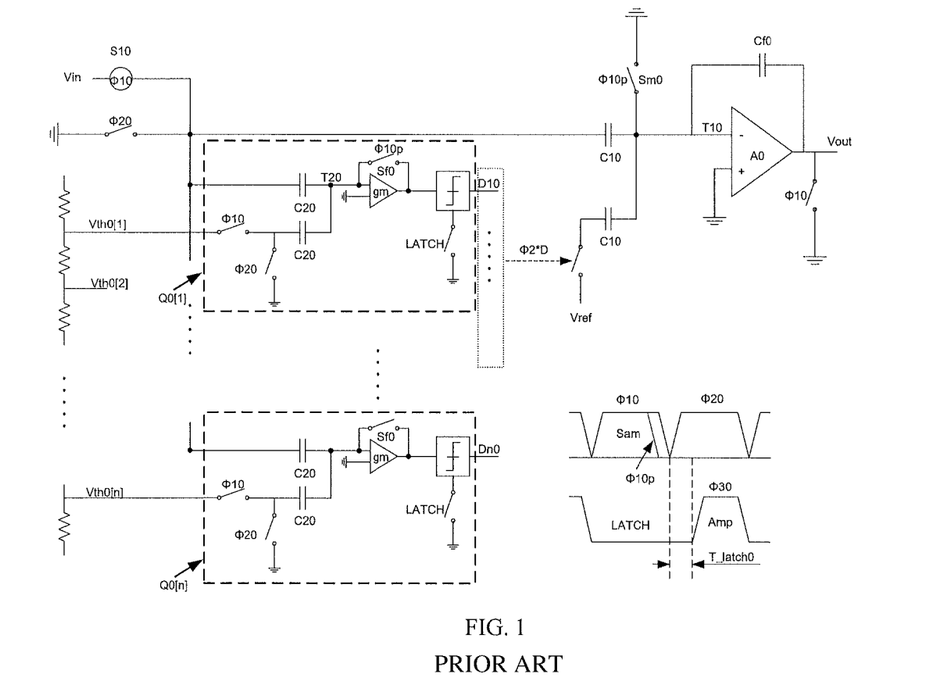
FIG. 1 is a schematic diagram of the conventional non-sample/hold high speed sampling front-end circuit.

A sampling front-end structure is shown in FIG. 1 for conventional pipelined A/D converter with non-sample/hold, wherein a MDAC sampling network includes a switch $S_{m0}$, two capacitors $C_{10}$, a comparator array including a switch $S_{f0}$ and two capacitors $C_{20}$.

Time constant of a MDAC sampling network is expressed as equation (1)

$$\tau_{MDC0} = 2C_{10} \cdot R_{S_{m0}} \quad (1)$$

Wherein, $R_{S_{m0}}$ is on-resistance of switch $S_{m0}$.

Time constant of a comparator sampling network is expressed as equation (2).

$$\tau_{Comp0} = 2C_{20} \cdot \frac{1}{g_m} \quad (2)$$

Wherein, $g_m$ is transconductance of a front operational amplifier of comparators, $(1/g_m)$ is impedance of a front op-amp of comparators at sampling phase.

Network matching is required as equation (3)

$$\tau_{MDC0} = \tau_{Comp0} \quad (3)$$

And, $$g_m = \sqrt{2\mu_n C_{ox} \left(\frac{W}{L}\right)_{comp0} I_D} \quad (4)$$

$$R_{S_{m0}} = \frac{1}{\mu_n C_{ox} \left(\frac{W}{L}\right)_{S_{m0}} V_{DD}} \quad (5)$$

Wherein, $\mu_n$ is electron mobility, $C_{ox}$ is capacitance of gate oxidation per unit, $$\left(\frac{W}{L}\right)_{comp0}$$

is width/length ratio of an input transistors of comparator, $I_D$ is current through an input transistor of comparator, $$\left(\frac{W}{L}\right)_{S_{m0}}$$

is width/length ratio of an MDAC sampling switch, $V_{DD}$ is power voltage.

According to equations (1) to (5), equation (6) is expressed as follows:

$$\frac{1/g_m}{R_{S_{m0}}} = \sqrt{\frac{\mu_n C_{ox}}{2\left(\frac{W}{L}\right)_{comp0} I_D}} \left(\frac{W}{L}\right)_{S_{m0}} V_{DD} = \frac{C_{10}}{C_{20}} \quad (6)$$

According to expression (6), network matching requires resistance ratio equal to capacitance ratio. Resistance ratio is not only relevant to absolute value of transistor size, but to process constant, power voltage and currents through devices. It is obvious that network matching depends on multiple conditions which make it hard to precisely match resistance of switch $S_m$ of a MDAC sampling network and impedance $(1/g_m)$ of front op-amp of a comparator array at sampling phase.

The mismatch of time constant leads to different input signals for a MDAC sampling network and a comparator sampling network at a time. The difference between two signals is taken as offset error of comparators.

$$V_{e\_offset0} = 2\pi f_{in}(\tau_{MDAC0} - \tau_{Comp0}) \quad (7)$$

Wherein, $f_{in}$ is input signal frequency.

According to equation (7), on condition of a certain offset error of comparators, the larger the mismatch of time constant $(\tau_{MDAC0} - \tau_{Comp0})$ is, the less input signal frequency $f_{in}$ the sampling network takes. In that way, the mismatch of the MDAC sampling network and the comparator array leads to a low tolerate input signal frequency for A/D converters.

A conventional sampling front-end structure for a non-sample/hold pipelined A/D converter is shown in FIG. 1. The feedback coefficient of the operational amplifier is expressed as equation (8):

$$\beta_0 = \frac{C_{f0}}{2C_{10} + C_{f0}} = \frac{\text{feedback\_capacitance}}{2 \times \text{sampling\_capacitance} + \text{feedback\_capacitance}} \quad (8)$$

Wherein, $C_{10}$ is sampling capacitance, $C_{f0}$ is feedback capacitance. As the denominator has two times the sampling capacitance $C_{10}$, the feedback coefficient is smaller. The smaller the feedback coefficient is, the larger power the circuit has. So two times of $C_{10}$ is a major cause for large power consumption.

A time sequence diagram of a conventional sampling front-end structure for a non-sample/hold pipelined A/D converter is shown in FIG. 1. Sampling phase (Φ10) covers 50% of clock circle. Comparison phase (T_latch0) and amplification phase (Φ30) take the other 50%, which greatly shortens the time of amplification phase and decreases maximum sampling rate for A/D converters.

SUMMARY OF THE PRESENT INVENTION

It is an object of the invention to provide a high speed sampling front-end circuit featuring good matching of sampling networks. It also has low power, high sampling rate and wide input bandwidth for sampling networks, and has simple circuit structure due to the employment of a high speed sampling front-end circuit without sample/hold circuit. The invention solves problems associated with the mismatching of MDAC sampling network and comparator sampling network causing input signal frequency drops, low feedback coefficient increasing power consumption and sampling rate drops with comparator settling time only covering MDAC amplification phase.

The foregoing object of the invention is accomplished as follows:

The invention provides a high speed sampling front-end circuit, including a MDAC sampling network, a comparator array, an operational amplifier, an output short-circuit switch, a clock duty cycle stabilizer, a reference voltage generator circuit, a status control module and a feedback control module.

The MDAC sampling network is used for sampling input signals.

The comparator array is used for sampling input signals and generating signals based on the comparison between input signal and threshold voltage. Comparison-based signals and clock signals from the clock duty cycle stabilizer tend to control working status of the MDAC sampling network through the status control module.

The status control module is connected to the MDAC sampling network to control working status of the MDAC sampling network.

One end of the feedback control module is connected to output end of the operational amplifier with the other end being connected to the MDAC sampling network.

The operational amplifier is used for equalizing voltages at two ends of the operational amplifier when the clock duty cycle stabilizer enters clock amplification phase.

The output short-circuit switch is designed to connect the output end of the operational amplifier to ground when the clock duty cycle stabilizer enters clock sampling phase;

The clock duty cycle stabilizer is used for generating clock signals with adjustable duty cycle that are designed to control working status of the MDAC sampling network, the comparator array, output short-circuit switch, status control module and feedback control module;

The reference voltage generator circuit is used for generating a group of reference voltages for the comparator array.

Further, the MDAC sampling network includes a first branch group, a second branch group, a third branch group and a MDAC sampling switch;

The first branch group includes k first-MDAC input switches and k first-MDAC input-end capacitors; the k first-MDAC input switches in parallel are connected to the k first-MDAC input-end capacitors in parallel through wire net [1];

The second branch group includes n−k+1 second-MDAC input switches and n−k+1 second-MDAC input-end capacitors; the n−k+1 second-MDAC input switches in parallel are connected to the n−k+1 second-MDAC input-end capacitors in parallel through wire net [2];

The third branch group includes n−1 third-MDAC input-end branches in parallel wherein each third-MDAC input-end branch includes a third-MDAC input switch and a third-MDAC input-end capacitor being connected to one another in series through wire net[(n+2):2n]; the third-MDAC input-end branches are connected to each other in parallel;

The first branch group, second branch group and third branch group are connected in parallel with one end being connected to input signal and the other end to a negative input end of the operational amplifier;

One end of the MDAC sampling switch Sm is connected to the negative input end of the operational amplifier and the other end to a positive input end of the operational amplifier; the positive input end of the operational amplifier is grounded.

Wherein, k is the number of the first-MDAC input-end capacitors; n is a half of the total number of the first, second, third-MDAC input switches, and that says $2n=k \cdot 2^x$, $k=2^m$, $x,m=1, 2, 3, \ldots$.

Further, the feedback control module is a switch group consisting of feedback control switches being connected in parallel; one end of each feedback control switch of the switch group is connected to output end of the operational amplifier and the other end to the wire between the first-MDAC input switch and the first-MDAC input-end capacitor of the first branch group of the MDAC sampling network.

Further, the comparator array includes n−1 comparators being connected in parallel. Each comparator includes a comparator sampling network, a comparison unit and a comparator sampling switch. The comparator sampling network includes a comparator signal input switch, a threshold input switch and a comparator sampling capacitor.

One end of the comparator signal input switch is connected to input signal end. One end of the threshold input switch is connected to the reference voltage generator circuit. The other end of the comparator signal input switch and the other end of the threshold input switch are connected to one another and then to the comparator sampling capacitor. Then the comparator sampling capacitor is connected to a positive end of the comparator unit. Comparator sampling switch is placed between positive end and negative end of the comparator unit. Output end of the comparator unit is connected to the status control module.

Further, the status control module includes a second-branch group control switch and a third-branch group control switch.

One end of the second-branch group control switch is connected to wire net [2] that is set between the second-MDAC input switch and the second-MDAC input-end capacitor of the second branch group, with the other end being grounded.

The third-branch group control switch includes n−1 converting switches. One end of each converting switch is placed between the third-MDAC input switch and the third-MDAC input-end capacitor of each third branch of the third-branch group, with the other end being grounded or connected to the reference voltage generator circuit.

Further, the clock duty cycle stabilizer (DCS) features adjustable duty cycle; the adjustable clock duty cycle stabilizer generates clock signals including a sampling phase clock signal $\Phi 1$, a comparison and amplification phase clock signal $\Phi 2$, a sampling phase clock advanced-switch-off signal $\Phi 1p$, and an amplification phase clock signal $\Phi 3$. The comparison and amplification phase clock signal $\Phi 2$ covers comparison time T_Comp and amplification time of a comparator. The sampling phase clock signal $\Phi 1$ and the comparison and amplification phase clock signal $\Phi 2$ are two non-overlapped phase clock signal.

Further, as the clock duty cycle stabilizer is at amplification phase clock signal $\Phi 3$, the n−1 third-MDAC input-end capacitors are used for DAC calculation; the first-MDAC input-end capacitors are used as feedback capacitors.

Further, feedback coefficient of the operational amplifier is k/2n.

Further, the MDAC sampling network and the comparator array are related as follows: the ratio of width/length ratio of the MDAC input switch of the MDAC sampling network to that of comparators of the comparator array equals to the ratio of MDAC sampling capacitance to comparator sampling capacitance. The ratio of width/length ratio of the MDAC sampling switch to that of the comparator sampling switch equals to the ratio of total capacitance of MDAC sampling network to comparator sampling capacitance.

The MDAC input switch is anyone of the first-MDAC, second-MDAC and third-MDAC input switches.

The comparator input switch can be the comparator signal input switch of any comparator sampling network of the comparators.

The MDAC sampling capacitor is anyone of the first-MDAC, second-MDAC or third-MDAC input-end capacitors.

The comparator sampling capacitor can be the comparator sampling capacitor of any comparator sampling network of the comparators.

The comparator sampling switch is anyone of the comparator sampling switches of the comparators;

The total capacitance of MDAC sampling network equals to the sum of the first-MDAC, second-MDAC and third-MDAC input-end capacitance.

Further, the sampling front-end circuit features gain of 2n/k.

Further, the first-MDAC, second-MDAC and third-MDAC input switches of the MDAC sampling network are isotype switches, and the comparator input switches of each comparator of the comparator array are isotype switches.

Further, the first-MDAC, second-MDAC and third-MDAC input switches of the MDAC sampling network are nMOS type boost switches, and the comparator input switches of each comparator of the comparator array are nMOS type boost switches.

Further, the MDAC sampling network and the comparator sampling network of each comparator of the comparator array apply single-end or differential connection structure.

The invention has following advantages: since the invention provides a high speed sampling front-end circuit, including a MDAC sampling network, a comparator array, an operational amplifier, an output short-circuit switch, an adjustable clock duty cycle stabilizer, a reference voltage generator circuit, a status control module and a feedback control module, compared to conventional non-sample/hold sampling front-end circuits, it has the following features:

1. As for conventional non-sample/hold sampling front-end circuit, the time constant matching between the MDAC sampling network and the comparator sampling network depends not only on absolute value of transistor size, but also process constant, power voltage and currents through devices. Obviously, it is hard to realize a precise time constant match for both. While the invention helps to realize a precise match of time constants of the MDAC sampling network and the comparator sampling network that are irrelevant to the absolute value of transistor size, process constant, power voltage and currents through devices.

2. The conventional sampling networks features low maximum input signal frequency, namely, low input bandwidth of sampling networks due to mismatching of sampling networks. The invention provides precisely-matched sampling networks in ways that improves the input bandwidth of the sampling networks.

3. The conventional sampling front-end circuit adds excrescent capacitors, besides sampling capacitors, as feedback capacitors and DAC calculation capacitors resulting in lower feedback coefficient and higher power consumption of the operational amplifier circuit. The invention uses sampling capacitors as feedback capacitors and DAC calculation capacitors in ways that double the feedback coefficient and realize a much simpler design and save 50% power of the operational amplifier circuit.

4. The conventional sampling front-end employs a clock of 50% duty cycle and features comparator settling time only taking up MDAC amplification phase which results in low sampling rate. The invention provides a sampling front-end circuit that employs adjustable clock duty cycle stabilizers and tends to compress sampling time and increase amplification phase. Comparing with the conventional one, the circuit realizes same settling time at a higher sampling rate which greatly increases sampling frequency.

5. It's normal for the conventional circuit that reference voltage generator circuit need two input reference voltage, while the invention provides a reference generator circuit featuring one input reference voltage in ways that simplifies the reference voltage (Vref) generator circuit (an auxiliary circuit).

To sum up, the invention has the advantages of matched-well sampling networks and features higher input bandwidth, lower power consumption, higher sampling rate and simpler auxiliary circuit, which efficiently overcomes the disadvantages of poor matched sampling networks, lower input bandwidth, higher power consumption, lower sampling rate and more complicated auxiliary circuit of the conventional non-sample/hold sampling front-end circuit.

The circuit provided by the present invention can find wide applications in pipelined A/D converters.

BRIEF DESCRIPTION OF THE DRAWINGS

To better understand the objects, technologies and advantages of the invention, the accompanying drawings are referred to for further description, wherein.

Wherein, you may refer to MDAC sampling network 1, comparator array 2, operational amplifier 3, output short-circuit switch 4, reference voltage generator circuit 5, status control module 6, feedback control module 7, clock duty cycle stabilizer 8, first branch group 11, second branch group 12, third branch group 13, MDAC sampling switch 14 and comparator 21.

DETAILED DESCRIPTION OF THE PREFERRED EMBODIMENTS

Hereinafter, the preferred embodiments of the invention will be described using the drawings. It should be understood that the following embodiments are provided just for describing the invention, instead of limiting the scope of the invention.

Embodiment 1

Figure 2:
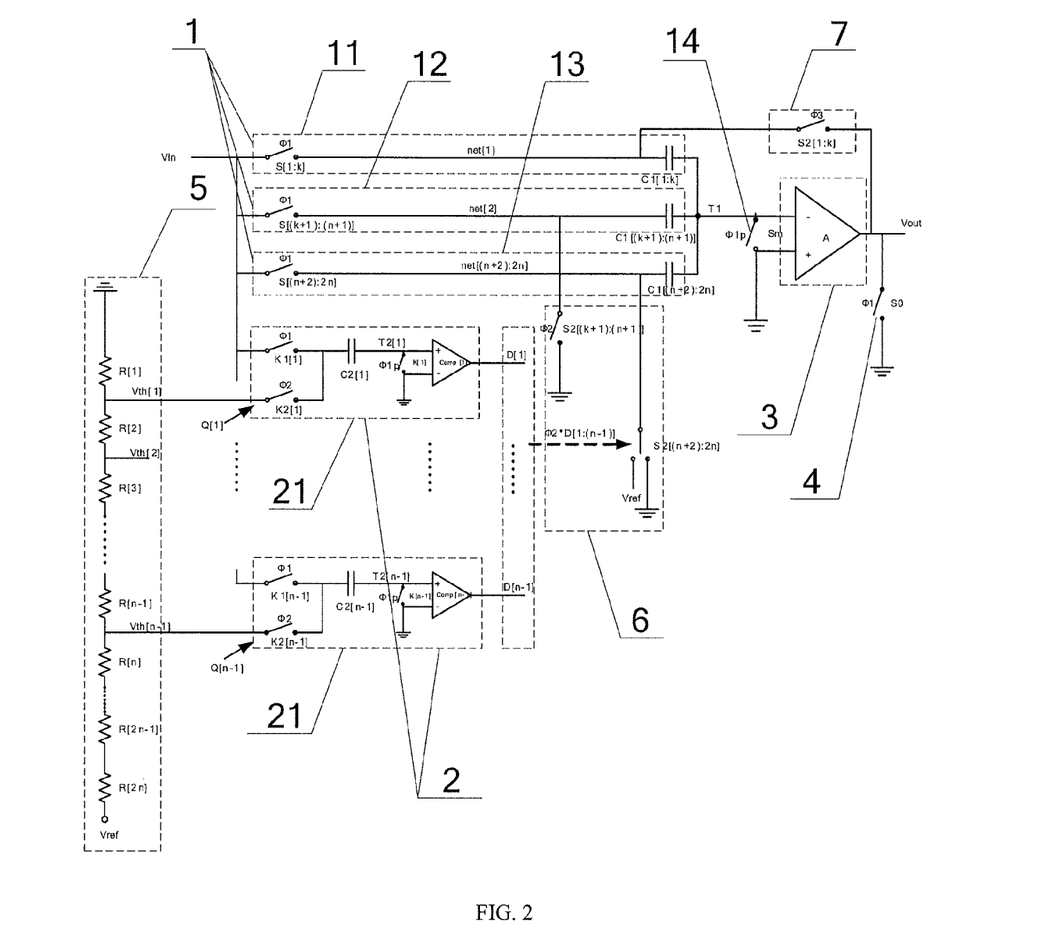
FIG. 2 is a schematic diagram of a non-sample/hold high speed sampling front-end circuit of the invention.
Figure 3:
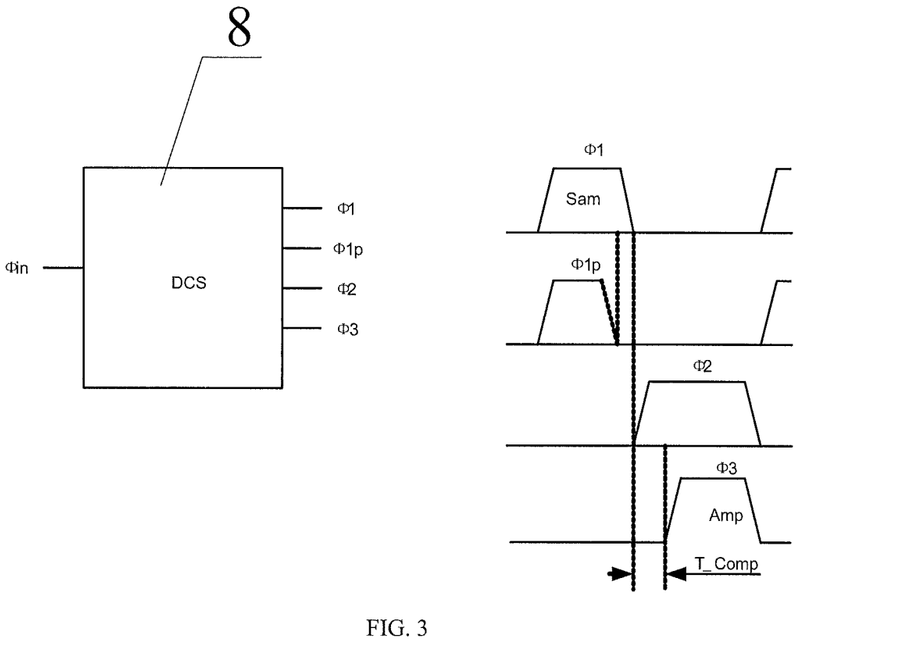
FIG. 3 is a timing diagram for a clock duty cycle stabilizer DCS with adjustable duty cycle, of the non-sample/hold high speed front-end circuit of the invention.
Figure 4:
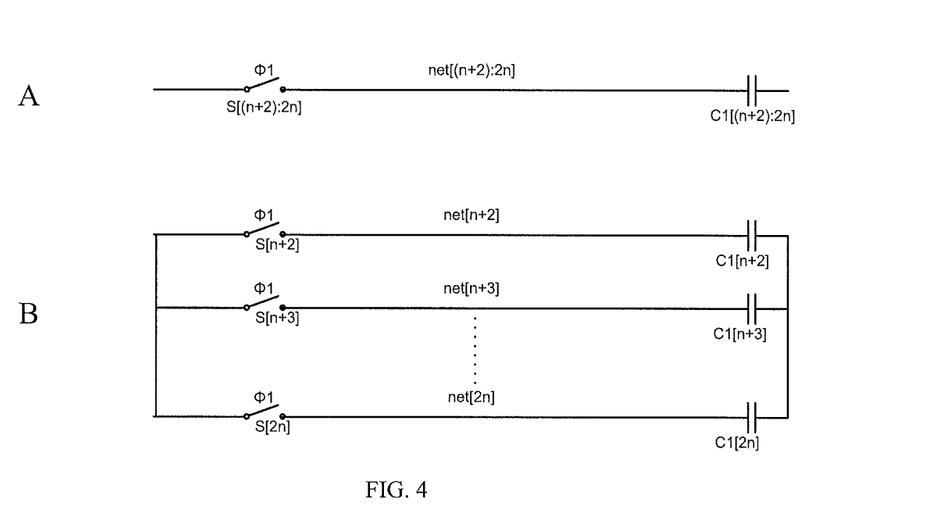
FIG. 4 is a network circuit equivalent diagram of the non-sample/hold high speed front-end circuit of the invention.

As shown in FIGS. 2, 3 and 4, S[1:k] denotes S[1], S[2], S[3], . . . , S[k]. In the same way, net[(n+2):2n] denotes net[n+2], net[n+3], net[n+4], . . . , net[2n]; C1[1:k] denotes C1[1], C1[2], C1[3], . . . , C1[k]. The invention provides a high speed sampling front-end circuit, including a MDAC sampling network, a comparator array, an operational amplifier, an output short-circuit switch, a clock duty cycle stabilizer, a reference voltage generator circuit, a status control module and a feedback control module.

The MDAC sampling network is used for sampling input signals Vin and connected to a negative input end of the operational amplifier; the MDAC sampling network includes a first branch group, a second branch group, a third branch group and a MDAC sampling switch Sm; As shown in FIG. 2, the first branch group includes k first-MDAC input switches S[1:k] and k first-MDAC input-end capacitors C1[1:k]; the k first-MDAC input switches in parallel are connected to the k first-MDAC input-end capacitors in parallel through wire net [1].

The second branch includes n−k+1 second-MDAC input switches S[(k+1):(n+1)] and n−k+1 second-MDAC input-end capacitors C1[(k+1):(n+1)]; the n−k+1 second-MDAC input switches in parallel are connected to the n−k+1 second-MDAC input-end capacitors in parallel through wire net [2].

The third branch group includes n−1 third-MDAC input-end branches in parallel wherein each third-MDAC input-end branch includes a third-MDAC input switch S[(n+2):2n] and a third-MDAC input-end capacitor C1[(n+2):2n] being connected to one another in series through wire net[(n+2):2n]; the third-MDAC input-end branches are connected to one another in parallel.

The first branch group, the second branch and the third branch group are connected in parallel with one end being connected to input signal and the other end to a negative input end of the operational amplifier;

One end of the MDAC sampling switch Sm is connected to a negative input end of the operational amplifier, and the other end to a positive input end of the operational amplifier; the positive input end of the operational amplifier is grounded.

Wherein, k is the number of the first-MDAC input-end capacitors; n is a half of the total number of the first, second, third-MDAC input switches, and that says $2n=k \cdot 2^x$, $k=2^m$, $x,m=1, 2, 3, \ldots$.

The feedback control module S2[1:k] is a switch group consisting of feedback control switches being connected in parallel; one end of each feedback control switch of the switch group is connected to a output end of the operational amplifier, and the other end to a wire between a first-MDAC input switch and a first-MDAC input-end capacitor of the first branch group of the MDAC sampling network.

The comparator array Q[1:(n−1)] includes n−1 capacitors being connected in parallel. Each comparator consists of a comparator sampling network, a comparison unit and a comparator sampling switch. The comparator sampling network includes a comparator signal input switch, a threshold input switch and a comparator sampling capacitor.

One end of the comparator signal input switch is connected to input signal Vin end. One end of the threshold input switch is connected to the reference voltage generator circuit. The other end of the comparator signal input switch and the other end of the threshold input switch are connected to one another and then to the comparator sampling capacitor. Then the comparator sampling capacitor is connected to a positive end of the comparator unit. The comparator sampling switch is placed between positive end and negative end of the comparator unit. The output end of the comparator unit is connected to the status control module.

As shown in FIG. 2, there are comparator signal input switches K1[1:(n−1)], threshold input switches K2[1:(n−1)], comparator sampling switches K[1:(n−1)], comparator sampling capacitors C2[1:(n−1)] and comparison units Comp[1:(n−1)];

The status control module includes a second-branch group control switch and a third-branch group control switch.

One end of the second-branch group control switch is connected to a wire net [2] that is set between a second-MDAC input switch and a second-MDAC input-end capacitor of the second branch group, the other end is grounded.

The third-branch group control switch includes n−1 converting switches. One end of each converting switch is placed between a third-MDAC input switch and a third-MDAC input-end capacitor of each third branch of the third-branch group, the other one is grounded or connected to the reference voltage generator circuit.

As shown in FIG. 2, S2[(k+1):(n+1)] refers to second-branch group control switch. Third-branch group control switch has n−1 converting switch S2[(n+2):2n].

The MDAC sampling network and the comparator sampling network are related as follows: the ratio of width/length ratio of MDAC input switch in the MDAC sampling network to that of comparator signal input switch in comparator sampling network equals to the ratio of MDAC sampling capacitance to comparator sampling capacitance. The ratio of width/length ratio of MDAC sampling switch Sm to that of comparator sampling switch equals to the ratio of total capacitance of MDAC sampling network to comparator sampling capacitance.

The MDAC input switch is anyone of the first-MDAC, second-MDAC and third-MDAC input switches.

The comparator input switch can be the comparator signal input switch of any comparator sampling network of the comparators.

The MDAC sampling capacitor is anyone of the first-MDAC, second-MDAC or third-MDAC input-end capacitors.

The comparator sampling capacitor is can be the comparator sampling capacitor of any comparator sampling network of the comparators.

The comparator sampling switch is anyone of the comparator sampling switches of the comparators.

The total capacitance of MDAC sampling network equals to the sum of first-MDAC, second-MDAC and third-MDAC input-end capacitance.

The status control module is connected to the MDAC sampling network to control working status of the MDAC sampling network; when a comparison and amplification phase signal Φ2 is high, the second-branch control switch S2[(k+1):(n+1)] is on. When the comparison and amplification phase clock signal Φ2 and a first comparator output signal D[1] are high at the same time, DAC calculation capacitor C1[n+2] is connected to the reference Vref, otherwise it is grounded. When comparison and amplification phase clock signal Φ2 and second comparator output signal D[2] are high at the same time, DAC calculation capacitor C1[n+2] is connected to Vref, otherwise it is grounded; . . . ; In the same way, when the comparison and amplification phase clock signal Φ2 and the n−1 comparator output signal D[n−1] are high at the same time, DAC calculation capacitor C1[2n] is connected to Vref, otherwise it is grounded.

One end of the feedback control module is connected to output end of the operational amplifier with the other end being connected to the MDAC sampling network.

Operational amplifier equalizes voltages at two ends of the operational amplifier when clock duty circle stabilizer meets clock amplification phase.

The output short-circuit switch So is designed to connect output end Vout of the operational amplifier to ground when clock duty circle stabilizer meets clock sampling phase.

The clock duty circle stabilizer generates clock signals with adjustable duty cycle that is designed to control working status of the MDAC sampling network, comparator array, output short-circuit switch, status control module and feedback control module.

Reference voltage generator circuit generates a group of reference voltages for the comparator array.

The clock duty circle stabilizer DCS features adjustable duty cycle; the clock signals generated by the clock duty circle stabilizer with adjustable duty cycle include a sampling phase clock signal $\Phi 1$, a comparison and amplification phase clock signal $\Phi 2$, a sampling phase advanced-switch-off signal $\Phi 1p$ and an amplification phase clock signal $\Phi 3$. The comparison and amplification phase clock signal $\Phi 2$ covers comparison time T_Comp and amplification time of the comparator. The sampling phase clock signal $\Phi 1$, and the comparison and amplification phase clock $\Phi 2$ are two non-overlapped phases clock signals.

As clock duty circle stabilizer is at amplification phase clock signal $\Phi 3$, the n−1 third-MDAC input-end capacitors are used for DAC calculation; the first-MDAC input-end capacitors are used as feedback capacitors.

The first-MDAC, second-MDAC and third-MDAC input switches in the MDAC sampling network are isotype switches, the comparator input switches of each comparator in the comparator array are isotype switches.

The first-MDAC, second-MDAC and third-MDAC input switches in the MDAC sampling network are nMOS type boost switches, the comparator input switches of each comparator in the comparator array are nMOS type boost switches.

Feedback coefficient of the operational amplifier is k/2n.

One end of the reference voltage generator circuit is input reference voltage Vref with the other end being grounded.

The gain of the whole sampling front-end circuit is 2n/k.

The operation principle of the sampling front-end circuit is follows: at clock sampling phase, the MDAC sampling network and the comparator array sample input signals at the same time. At clock comparison phase, comparators compare input signals with threshold voltage and then outputs a logic result D[1:(n−1)] being used to connect the left plate of the third-MDAC input-end capacitor (namely DAC calculation capacitor) to either the reference voltage Vref or ground. At the same time, the switch S2[(k+1):(n+1)] is on and the MDAC sampling switch Sm is off in ways that make input voltage and DAC voltage be subtracted from one another. As feedback switch group S2[1:k] are on, the result from subtracting two voltages is output through amplification.

Embodiment 2

Figure 5:
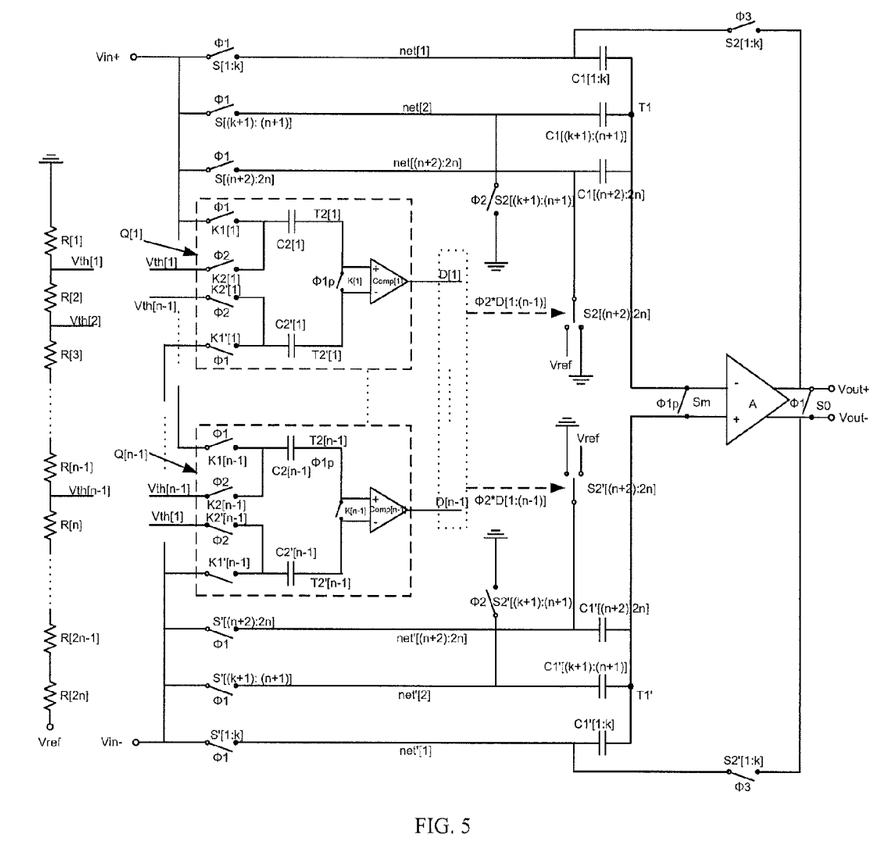
FIG. 5 is a schematic diagram showing a differential connection form of the non-sample/hold high speed front-end circuit of the invention.

FIG. 5 is a schematic diagram showing differential connection form of the non-sample/hold high speed sampling front-end circuit of the invention. As shown in FIG. 5, the difference between the present embodiment and embodiment 1 lies in as follow:

The invention provides another way to realize a high speed sampling front-end circuit. The MDAC sampling network employs differential connection form, and the comparator sampling network of each comparator in the comparator array employs differential connection form at the same time. Or, the MDAC sampling network employs single-end connection form, and the comparator sampling network of each comparator in the comparator array employs single-end connection form at the same time.

Embodiment 3

Operation procedure and principle of the high speed sampling front-end circuit are explained in details:

For convenience, hereinafter, the first-MDAC input switches are named as S[1:k] and S'[1:k], the first-MDAC input-end capacitors are named as C1[1:k] and C1'[1:k], the second-MDAC input switches are named as S[(k+1):(n+1)] and S'[(k+1):(n+1)], the second-MDAC input-end capacitors are named as C1[(k+1):(n+1)] and C1'[(k+1):(n+1)], the third-MDAC input switches are named as S[(n+2):2n] and S'[(n+2):2n], the third-MDAC input-end capacitors are named as C1[(n+2):2n] and C1'[(n+2):2n], the MDAC sampling switch is named as Sm.

When sampling phase clock signal $\Phi 1$ is high, the sampling front-end circuit works at sampling phase; switches S2[1:2n] and S2'[1:2n] are off; switches S[1:2n] and S'[1:2n] are on; the left plate of the capacitor C1[1:2n] is connected to input signal Vin+; the left plate of the capacitor C1'[1:2n] is connected to input signal Vin−; the switch Sm is on; the right plate of the capacitor C1[1:2n] is connected to the negative input-end of the operational amplifier A; the right plate of the capacitor C1'[1:2n] is connected to the positive input-end of the operational amplifier A; two input-ends of the operational amplifier A are shorted, and then the switch So is on; two output-end of the operational amplifier A are shorted. Switches K2[1:(n−1)] and K2'[1:(n−1)] are off, switches K1[1:(n−1)] and K1'[1:(n−1)] are on; the left plate of the capacitor C2[1:(n−1)] is connected to input signal Vin+, the left plate of the capacitor C2'[1:(n−1)] is connected to input signal Vin−, switches K[1:(n−1)] and K'[1:(n−1)] are on; the right plate of the capacitor C2[1:(n−1)] is connected to the positive input end of the comparator unit, the right plate of the capacitor C2'[1:(n−1)] is connected to the negative input end of the comparator unit. Two input ends of the comparator unit C2'[1:(n−1)] are shorted. Sampling phase advanced-switch-off signal $\Phi 1p$ is sampling clock whereof the falling edge time is sampling time.

When the comparison and amplification phase clock signal $\Phi 2$ is high, and the amplification phase clock signal $\Phi 3$ is low, the sampling front-end circuit works at comparison phase. At this point, switches S[1:2n] and S'[1:2n] are off; S2[1:k] and S2'[1:k] are off; switches S2[(k+1):(n+1)] and S2'[(k+1):(n+1)] are on; the left plates of capacitors C1[(k+1):(n+1)] and C1'[(k+1):(n+1)] are grounded; switches Sm and So are off. Switches K1[1:(n−1)] and K1'[1:(n−1)] are off; switches K[1:(n−1)] and K'[1:(n−1)] are off; switches K2[1:(n−1)] and K2'[1:(n−1)] are on; the comparator sampling capacitor C2[1] is connected to reference voltage Vth[1], and C2[2] to reference voltage Vth[2], . . . , C2[n−1] to reference voltage Vth[n−1]. The comparator sampling capacitor C2'[1] is connected to reference voltage Vth[n−1], and C2'[2] to reference voltage Vth[n−2], . . . , C2'[n−1] to reference voltage Vth[1], then comparators starts to work; Then, comparators output logic results D[1:(n−1)]. The logic results D[1:(n−1)] and the comparison and amplification phase clock signal $\Phi 2$ are used to control switches S2[(n+2):2n] and S2'[(n+2):2n]. When the logic result D[1] and the comparison and amplification phase clock signal $\Phi 2$ are high, switch S2[n+2] is connected to Vref and S2'[n+2] is grounded. Otherwise, S2[n+2] is grounded and S2'[n+2] is connected to Vref; When D[2] and the comparison and amplification phase clock signal 12 are high, switch S2[n+3] is connected to Vref and S2'[n+3] is grounded. Otherwise, S2[n+3] is grounded and S2'[n+3] is connected to Vref; . . . ; When D[n−1] and the comparison and amplification phase clock signal Φ2 are high, switch S2[2n] is connected to Vref and S2'[2n] is grounded. Otherwise, S2[2n] is grounded and S2'[2n] is connected to Vref.

When comparison and amplification phase clock signal Φ2 and amplification phase clock signal Φ3 are high, the sampling front-end circuit works at amplification phase. At this point, switches S[1:2n] and S'[1:2n] are off, switches S2[1:k] and S2'[1:k] are on, the left plate of the capacitor C1[1:k] is connected to the output-end Vout+ of the operational amplifier, and the left plate of the capacitor C1'[1:k] is connected to the output-end Vout−, which forms a feedback; switches S2[(k+1):(n+1)] and S2'[(k+1):(n+1)] are on, the left plates of capacitors C1[(k+1):(n+1)] and C1'[(k+1):(n+1)] are grounded, switches Sm and So are off; switches S2[(n+2):2n] 和 S2'[(n+2):2n] are on, capacitors C1[(n+2):2n] and C1'[(n+2):2n] are either connected to the reference voltage Vref or grounded. At this point, MDAC subtracts the quantized input signals from input signals and generates an amplified residual output (Vout+)−(Vout−).

At sampling phase, the time constant of the MDAC sampling network is expressed as equation (9).

$$\tau_{MDC} = \left(\frac{1}{2}R_{S_m} + \frac{1}{2n}R_{S[i]}\right) \cdot \Sigma C1[1:2n] = \left(\frac{1}{2}R_{S_m} + \frac{1}{2n}R_{S[i]}\right) \cdot C1, \quad (9)$$
$$i = 1, \ldots, 2n$$

Wherein, C1 is the sum of sampling capacitance; $R_{S_m}$ is the on-resistance of the sampling switch Sm.

That is to say, C1 is total sampling capacitance of single-end MDAC, including single-end first-MDAC input-end capacitance, single-end second-MDAC input-end capacitance and single-end third-MDAC input-end capacitance.

At sampling phase, the time constant of the comparator network is expressed as equation (10).

$$\tau_{Comp} = \left(R_{K1[i]} + \frac{1}{2}R_{K[i]}\right) \cdot C2[i], \quad (10)$$
$$i = 1, \ldots, (n-1)$$

Network matching is required as equation (11).

$$\tau_{MDC} = \tau_{Comp} \quad (11)$$

And, $$R_{S_m} = \frac{1}{\mu_n C_{ox}\left(\frac{W}{L}\right)_{S_m} V_{DD}} \quad (12)$$

$$R_{S[i]} = \frac{1}{\mu_n C_{ox}\left(\frac{W}{L}\right)_{S[i]} V_{DD}} \quad (13)$$

$$R_{K1[i]} = \frac{1}{\mu_n C_{ox}\left(\frac{W}{L}\right)_{K1[i]} V_{DD}} \quad (14)$$

-continued $$R_{K[i]} = \frac{1}{\mu_n C_{ox}\left(\frac{W}{L}\right)_{K[i]} V_{DD}} \quad (15)$$

Wherein, $\mu_n$ is electron mobility, $C_{ox}$ is oxidation capacitance per unit, $$\left(\frac{W}{L}\right)_{S_m}$$

is the width-to-length ratio of the MDAC sampling switch Sm, $$\left(\frac{W}{L}\right)_{S[i]}$$

is the width-to-length ratio of MDAC input switch S[i], $$\left(\frac{W}{L}\right)_{K1[i]}$$

is the width-to-length ratio of comparator input switch K1[i], $$\left(\frac{W}{L}\right)_{K[i]}$$

is the width-to-length ratio of comparator sampling switch K[i], $V_{DD}$ is power voltage.

According to equation (9) to (15), equation (16) is expressed as follows.

$$\frac{C1}{C2[i]} = \frac{\dfrac{1}{\left(\frac{W}{L}\right)_{K1[i]}} + \dfrac{1}{2 \cdot \left(\frac{W}{L}\right)_{K[i]}}}{\dfrac{1}{2n} \dfrac{1}{\left(\frac{W}{L}\right)_{S[i]}} + \dfrac{1}{2 \cdot \left(\frac{W}{L}\right)_{S_m}}} \quad (16)$$

If equation (17) and (18) are realized, equation (16) would be realized in ways that realize a precise matching of the MDAC sampling network and the comparator array.

$$\frac{C1[i]}{C2[i]} = \frac{\left(\frac{W}{L}\right)_{S[i]}}{\left(\frac{W}{L}\right)_{K1[i]}} \quad (17)$$

$$\frac{C1}{C2[i]} = \frac{\left(\frac{W}{L}\right)_{S_m}}{\left(\frac{W}{L}\right)_{K[i]}} \quad (18)$$

The mismatch of time constant makes the MDAC sampling network and the comparator array sample two different input signals. The difference between both signals equals to comparator offset error.

$$V_{e\_offset}=2\pi f_{in}(\tau_{MDAC}-\tau_{Comp}) \quad (19)$$

Wherein, $f_n$ is input signal frequency.

At amplification phase, the feedback coefficient of the operational amplifier A is expressed as equation 20.

$$\beta = \frac{\Sigma C1[1:k]}{\Sigma C1[1:2n]} = \frac{C_f}{C1} = \frac{k}{2n} = \frac{feedback\_capacitance}{sampling\_capacitance} \quad (20)$$

To sum up, first, by comparing equation (8) and equation (17), (18), it can be found that in the invention, the time constant matching between the MDAC sampling network and the comparator array only depends on devices' width/length ratio but the absolute value of device size, process constants, power voltage and currents through devices. A precise matching of the MDAC sampling network and the comparator array can be realized if the ratio of the width/length ratio of MDAC input switch to that of the comparator input switch equals to the ratio of MDAC sampling capacitance to comparator sampling capacitance; and the ratio of width/length ratio of MDAC sampling switch to that of comparator sampling switch equals to the ratio of MDAC sampling capacitance to comparator sampling capacitance. According to equation (19), on condition of a certain offset error of comparators, the smaller the mismatch ($\tau_{MDAC}-\tau_{Comp}$) of time constants is, the higher input signal frequency $f_{in}$ the sampling network bears. Therefore, the precise matching of the MDAC sampling network and the comparator array helps to greatly improve the input bandwidth of the sampling front-end circuit.

Second, according to equation (8) and (20), the invention provides a sampling front-end circuit featuring a feedback coefficient twice than that of a conventional circuit. Therefore, with the same settling time, the circuit features 50% bandwidth of a conventional non-sample/hold front-end operational amplifier, boasts a simpler op-amp and save 50% power at least.

Third, the sampling front-end circuit of the invention uses adjustable clock duty cycle stabilizer DCS that generates clock signals including a sampling phase clock signal Φ1, a comparison and amplification phase clock signal Φ2, a sampling phase advanced-switch-off signal Φ1p, an amplification phase clock signal Φ3; the sampling signal Φ1, comparison phase T_Comp, amplification phase clock signal Φ3 are adjustable for shortening sampling phase time and increasing amplification phase time in ways that improve sampling rate.

Besides, the invention applies boost switches for the MDAC input switches S[1:2n] and comparator input switches K1[1:2n], to improve sampling linearity.

The foregoing preferred embodiments are provided to describe, not to limit, technical approaches in the invention. Obviously, bearing the essence and concept of the invention, technologists in this field can make various changes and redesigns to the invention. It should be understood that those changes and redesigns are also covered by claims of the invention, if they are with the same purpose and within the same scope of the present invention.

What is claimed is:

1. A high speed sampling front-end circuit including a MDAC sampling network, a comparator array, an operational amplifier, an output short-circuit switch, a clock duty cycle stabilizer, a reference voltage generator circuit, a status control module and a feedback control module, wherein said MDAC sampling network includes a first branch group, a second branch group, a third branch group and a MDAC sampling switch, and is used for sampling input signals;

said comparator array includes (n−1) comparators being connected to one another in parallel, and is used for sampling input signals and generating comparison-based signals through comparison between input signals and threshold voltages, wherein the comparison-based signals and the clock signals from the clock duty cycle stabilizer are used to control the working status of the MDAC sampling network through the status control module;

said status control module includes a second-branch group control switch and a third-branch group control switch, and is connected to the MDAC sampling network to control the working status of the MDAC sampling network;

said feedback control module is a switch group consisting of feedback control switches being connected in parallel, one end of said feedback control module is connected to an output end of the operational amplifier with the other end being connected to the MDAC sampling network;

feedback coefficient of said operational amplifier is k/2n, said operational amplifier is used for equalizing voltages at two ends of the operational amplifier when the clock duty cycle stabilizer is at clock amplification phase;

said output short-circuit switch is used for connecting an output end of the operational amplifier to ground when the clock duty cycle stabilizer is at clock sampling phase;

said clock duty cycle stabilizer is used for generating clock signals with adjustable duty cycle, that are used to control the working status of the MDAC sampling network, comparator array, output short-circuit switch, status control module and feedback control module; and said reference voltage generator circuit is used for generating a group of reference voltages for the comparator array.

2. A high-speed sampling front-end circuit according to claim 1, wherein, in the said MDAC sampling network:

said first branch group includes k first-MDAC input switches and k first-MDAC input-end capacitors, said k first-MDAC input switches in parallel are connected to the k first-MDAC input-end capacitors in parallel through wire net[1];

said second branch group includes n−k+1 second-MDAC input switches and n−k+1 second-MDAC input-end capacitors, said n−k+1 second-MDAC input switches in parallel are connected to the n−k+1 second-MDAC input-end capacitors in parallel through wire net[2];

said third branch group includes n−1 third-MDAC input-end branches in parallel, wherein each third-MDAC input-end branch includes a third-MDAC input switch and a third-MDAC input-end capacitor being connected to one another in series through wire net[(n+2):2n]; said third-MDAC input-end branches are connected to each other in parallel;

said first branch group, second branch group and third branch group are connected in parallel with one end being connected to input signal and the other end to a negative input end of the operational amplifier;

one end of said MDAC sampling switch Sm is connected to a negative input end of the operational amplifier and the other end to a positive input end of the operational amplifier; and wherein, k is the number of first-MDAC input-end capacitors; n is a half of the total number of the first, second, third-MDAC input switches, and that says $2n=k\cdot 2^x$, $k=2^m$, x,m=1, 2, 3, . . . .

3. A high-speed sampling front-end circuit according to claim 2, wherein, in the said feedback control module: one end of each feedback control switch of the switch group is connected to an output end of the operational amplifier and the other end to a wire between the first-MDAC input switch and the first-MDAC input-end capacitor of the first branch group of the MDAC sampling network.

4. A high speed sampling front-end circuit according to claim 2, wherein, in the said status control module:

one end of said second-branch group control switch is connected to a wire net[2] that is set between the second-MDAC input switch and the second-MDAC input-end capacitor of the second branch group, with the other end being grounded; and said third-branch group control switch includes n−1 converting switches; one end of each converting switch is placed between a third-MDAC input switch and a third-MDAC input-end capacitor of each branch of the third-branch group; the other end is grounded or connected to the reference voltage generator circuit.

5. A high-speed sampling front-end circuit according to claim 2, wherein, said sampling front-end circuit features gain of 2n/k.

6. A high-speed sampling front-end circuit according to claim 2, wherein, the first-MDAC, second-MDAC and third-MDAC input switches of said MDAC sampling network are isotype switches, and the comparator input switches of each comparator of said comparator array are isotype switches.

7. A high-speed sampling front-end circuit according to claim 2, wherein, the first-MDAC, second-MDAC and third-MDAC input switches of said MDAC sampling network are nMOS type boost switches, and the comparator input switches of each comparator of said comparator array are nMOS type boost switches.

8. A high-speed sampling front-end circuit according to claim 1, wherein, in the said comparator array: each said comparator includes a comparator sampling network, a comparison unit and a comparator sampling switch; said comparator sampling network includes a comparator signal input switch, a threshold input switch and a comparator sampling capacitor;

one end of said comparator signal input switch is connected to input signal end; one end of said threshold input switch is connected to the reference voltage generator circuit; the other end of said comparator signal input switch and the other end of said threshold input switch are connected to one another and then to the comparator sampling capacitor; then said comparator sampling capacitor is connected to a positive end of the comparator unit; the comparator sampling switch is placed between a positive end and a negative end of said comparator unit; an output end of said comparator unit is connected to the status control module.

9. A high-speed sampling front-end circuit according to claim 1, wherein, said clock duty cycle stabilizer DCS features adjustable duty cycle; the adjustable clock duty cycle stabilizer generates clock signals including a sampling phase clock signal Φ1, a comparison and amplification phase clock signal Φ2, a sampling phase advanced-switch-off signal Φ1p, an amplification phase clock signal Φ3; said comparison and amplification phase clock signal Φ2 covers comparison time T_Comp and amplification time of a comparator; said sampling phase clock signal Φ1 and said comparison and amplification phase clock signal Φ2 are two non-overlapped phases clock signals.

10. A high-speed sampling front-end circuit according to claim 9, wherein, as said clock duty cycle stabilizer is at amplification phase clock signal Φ3, the (n−1) third-MDAC input-end capacitors are used for DAC calculation; the first-MDAC input-end capacitors are used as feedback capacitors.

11. A high-speed sampling front-end circuit according to claim 1, wherein, said MDAC sampling network and comparator array are related as follows: the ratio of width/length ratio of a MDAC input switch of the MDAC sampling network to that of a comparator of the comparator array equals to the ratio of MDAC sampling capacitance to comparator sampling capacitance; and the ratio of width/length ratio of the MDAC sampling switch to that of the comparator sampling switch equals to the ratio of total capacitance of MDAC sampling network to comparator sampling capacitance;

said MDAC input switch is anyone of the first-MDAC, second-MDAC and third-MDAC input switches;

said comparator input switch is the comparator signal input switch of any comparator sampling network of the comparators;

said MDAC sampling capacitor is anyone of the first-MDAC, second-MDAC or third-MDAC input-end capacitors;

said comparator sampling capacitor is the comparator sampling capacitor of any comparator sampling network of the comparators;

said comparator sampling switch is anyone of the comparator sampling switches of the comparators; and said total capacitance of MDAC sampling network equals to the sum of the first-MDAC, second-MDAC and third-MDAC input-end capacitances.

12. A high-speed sampling front-end circuit according to claim 1, wherein said MDAC sampling network and the comparator sampling network of each comparator of said comparator array apply single-end or differential connection structure.

\* \* \* \* \*